(12) United States Patent
Chen et al.

(10) Patent No.: US 7,529,132 B2
(45) Date of Patent: May 5, 2009

(54) SINGLE-POLY NON-VOLATILE MEMORY

(75) Inventors: Chao Yang Chen, Jhubei (TW); Yider Wu, Banciao (TW); Hsiao Hua Lu, Jhudong Township, Hsinchu County (TW)

(73) Assignee: Eon Silicon Solution Inc. (TW)

( * ) Notice: Subject to any disclaimer, the term of this patent is extended or adjusted under 35 U.S.C. 154(b) by 142 days.

(21) Appl. No.: 11/762,369

(22) Filed: Jun. 13, 2007

(65) Prior Publication Data

US 2008/0273399 A1 Nov. 6, 2008

(30) Foreign Application Priority Data

May 2, 2007 (TW) ............................... 96115536 A

(51) Int. Cl.
*G11C 11/34* (2006.01)
(52) U.S. Cl. .............................. 365/185.17; 365/185.05
(58) Field of Classification Search ............ 365/185.17, 365/185.05
See application file for complete search history.

(56) References Cited

U.S. PATENT DOCUMENTS

| | | | |
|---|---|---|---|
| 5,568,421 A * | 10/1996 | Aritome ................. | 365/185.17 |
| 5,706,241 A * | 1/1998 | Nakamura et al. .......... | 365/226 |
| 5,841,165 A | 11/1998 | Chang et al. | |
| 6,711,064 B2 | 3/2004 | Hsu et al. | |
| 6,965,142 B2 | 11/2005 | Diorio et al. | |
| 7,092,294 B2 * | 8/2006 | Sato et al. ............... | 365/185.27 |
| 7,184,308 B2 * | 2/2007 | Kwon et al. ............ | 365/185.17 |
| 7,369,438 B2 * | 5/2008 | Lee ......................... | 365/185.17 |
| 7,411,825 B2 * | 8/2008 | Kutsukake et al. ...... | 365/185.17 |
| 7,411,826 B2 * | 8/2008 | Ichige et al. ............ | 365/185.17 |
| 2006/0114719 A1 * | 6/2006 | Lee ......................... | 365/185.17 |

* cited by examiner

*Primary Examiner*—Tuan T. Nguyen
(74) *Attorney, Agent, or Firm*—Connolly Bove Lodge & Hutz LLP; Myron Keith Wyche

(57) ABSTRACT

A single-poly non-volatile memory includes a storing node, a control node and a floating gate. While a programming operation is executed, a bit line is provided with a low voltage and a control line is provided with a high voltage so that a coupling voltage occurs in the floating gate. The voltage difference between the floating gate and the storing node is able to send electrons into the floating gate, but the voltage difference between the floating gate and the control node is not enough to expel electrons from the floating gate. While an erasing operation is executed, a bit line is provided with a high voltage and a control line is provided with a low voltage so that a coupling voltage occurs on the floating gate. The voltage difference between the floating gate and the storing node is able to expel electrons from the floating gate, but the voltage difference between the floating gate and the control node is not enough to send electrons into the floating gate.

20 Claims, 8 Drawing Sheets

SINGLE-POLY NON-VOLATILE MEMORY

BACKGROUND OF THE INVENTION

1. Field of the Invention

The present invention relates to a single-poly non-volatile memory, and more particularly, to an embedded non-volatile memory manufactured by a logic process.

2. Description of the Related Art

Except for standard products, non-volatile memories, such as flash memory and electrically erasable programmable read only memory (EEPROM), are widely applied to embedded chip designs. As far as the standard products are concerned, a large volume is desired in order to reduce the cost. However, only a small volume of an embedded chip is usually requested, such as 1 kilobyte, but it needs to be compatible with the existing logic process, like the CMOS process. For example, as far as the advanced eternal on-chip non-volatile (AEON) memory and simplified FN program erase (SFPE) non-volatile memory is concerned, they are especially suitable to the applications which need only a small amount of non-volatile memory, for example, storing and updating passwords, product information, system configuration, adjustment, recording user's preferences and repairing static random access memory (SRAM). Currently the biggest disadvantage of the embedded non-volatile memory compared with the logic process is some additional processes, even up to four additional masks.

Because the application of the embedded non-volatile memory is more popular than ever before, it is necessary for the industry to research a method of manufacturing the embedded non-volatile memory which could cooperate well with the existing logic process.

SUMMARY OF THE INVENTION

The present invention uses voltage difference between a control line, bit line and floating gate to generate the Fowler-Nordheim (FN) tunneling effect to absorb or expel electrons. When the single-poly non-volatile memory of the present invention is executing an erasing operation, by means of the reverse voltage difference between the floating gate and the storage node, the electrons inside the floating gate will be expelled. When the single-poly non-volatile memory of the present invention is executing a programming operation, by means of the positive voltage difference between the floating gate and the storage node, the electrons will be absorbed into the floating gate.

The single-poly non-volatile memory according to an embodiment of the present invention comprises a plurality of non-volatile memory cells. The non-volatile memory cell includes a first N-type transistor, a second N-type transistor, a third N-type transistor, a fourth N-type transistor and a floating gate. The first N-type transistor has a source, a gate and a drain, and the source connects to a source line. The second N-type transistor has a source, a gate and a drain; where the drain connects to a bit line, the source commonly shares the drain of the first transistor, and the gate connects to a word line. The third N-type transistor has a source, a gate and a drain. The fourth N-type transistor has a source, a gate and a drain; where the source commonly shares the drain of the third transistor, the drain connects to a control line, and the gate connects to the word line. The floating gate connects to the gates of the first and third N-type transistors. The ratio of the gate capacitance of the first N-type transistor to that of the third N-type transistor is smaller than 2:3.

The single-poly non-volatile memory according to an embodiment of the present invention comprises a plurality of non-volatile memory cells. The non-volatile memory cell includes a storage node, a control node and a floating gate. The storage node is formed by N-type transistors, where one end connects to a source line, and the other end connects to a bit line through a contact plug. The control node is formed by N-type transistors, where one end connects to a control line through a contact plug, and gates of the control node and storage node connect to a word line. The floating gate connects to the other gates of the control node and storage node. The bit line is at a low voltage and the control line is at a high voltage level so that a coupling voltage occurs on the floating gate, where the voltage difference between the floating gate and the storage node is able to absorb electrons into the floating gate, but the voltage difference between the floating gate and the control node is not big enough to expel electrons from the floating gate when a programming operation is being executed. The bit line is at a high voltage and the control line is at a low voltage level so that a coupling voltage occurs on the floating gate, where the voltage difference between the floating gate and the storage node can expel electrons from the floating gate, but the voltage difference between the floating gate and the control node is not big enough to absorb electrons into the floating gate when an erasing operation is being executed.

BRIEF DESCRIPTION OF THE DRAWINGS

The invention will be described according to the appended drawings in which.

PREFERRED EMBODIMENT OF THE PRESENT INVENTION

Figure 1:
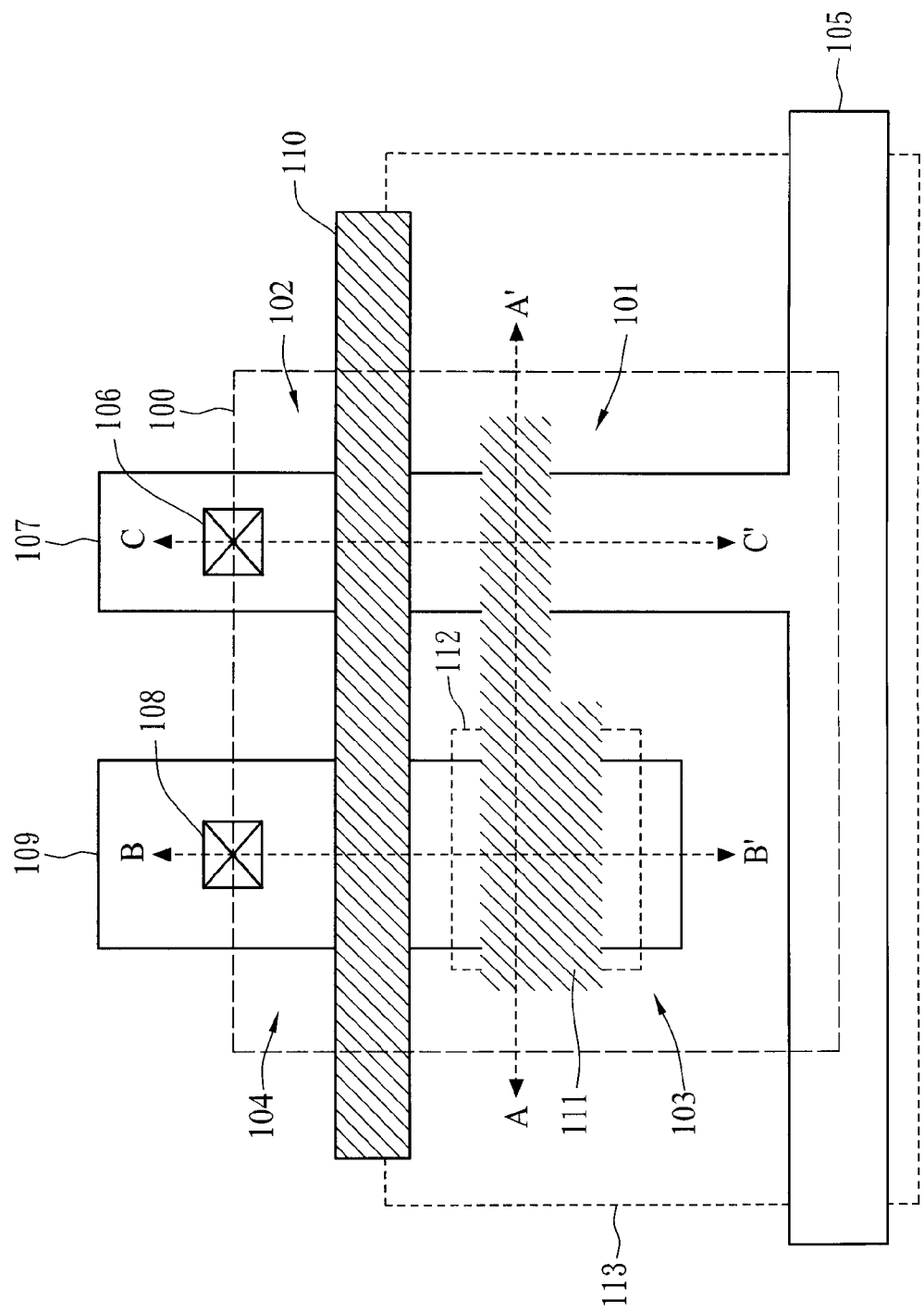
FIG. 1 shows a top view of the non-volatile memory cell according to one embodiment of the present invention.

FIG. 1 shows a top view of the non-volatile memory cell according to one embodiment of the present invention. A single-poly non-volatile memory cell 100 includes a first N-type transistor 101, a second N-type transistor 102, a third N-type transistor 103 and a fourth N-type transistor 104. A storage node 107 could be arranged to include the first N-type transistor 101 and the second N-type transistor 102, and a control node 109 could be arranged to include the third N-type transistor 103 and the fourth N-type transistor 104. The source of the first N-type transistor 101 connects to a source line 105, and the drain of the second N-type transistor 102 connects to a bit line through a contact point 106. The drain of the first N-type transistor 101 commonly shares the source of the second N-type transistor 102. Similarly, the drain of the third N-type transistor 103 commonly shares the source of the fourth N-type transistor 104 as well. The drain of the fourth N-type transistor 104 connects to a control line through a contact plug 108. In the horizontal direction, the gates of the second N-type transistor 102 and fourth N-type transistor 104 connect to a word line 110. If the word line 110 is at a high-voltage level, the second N-type transistor 102 and the fourth N-type transistor 104 are turned on. The gates of the first N-type transistor 101 and the third N-type transistor 103 are connected together with a floating gate 111. The first and third N-type transistors 101 and 103 should not overlap the adjacent region made by a salicide process so as to avoid leakage paths.

Figure 2:
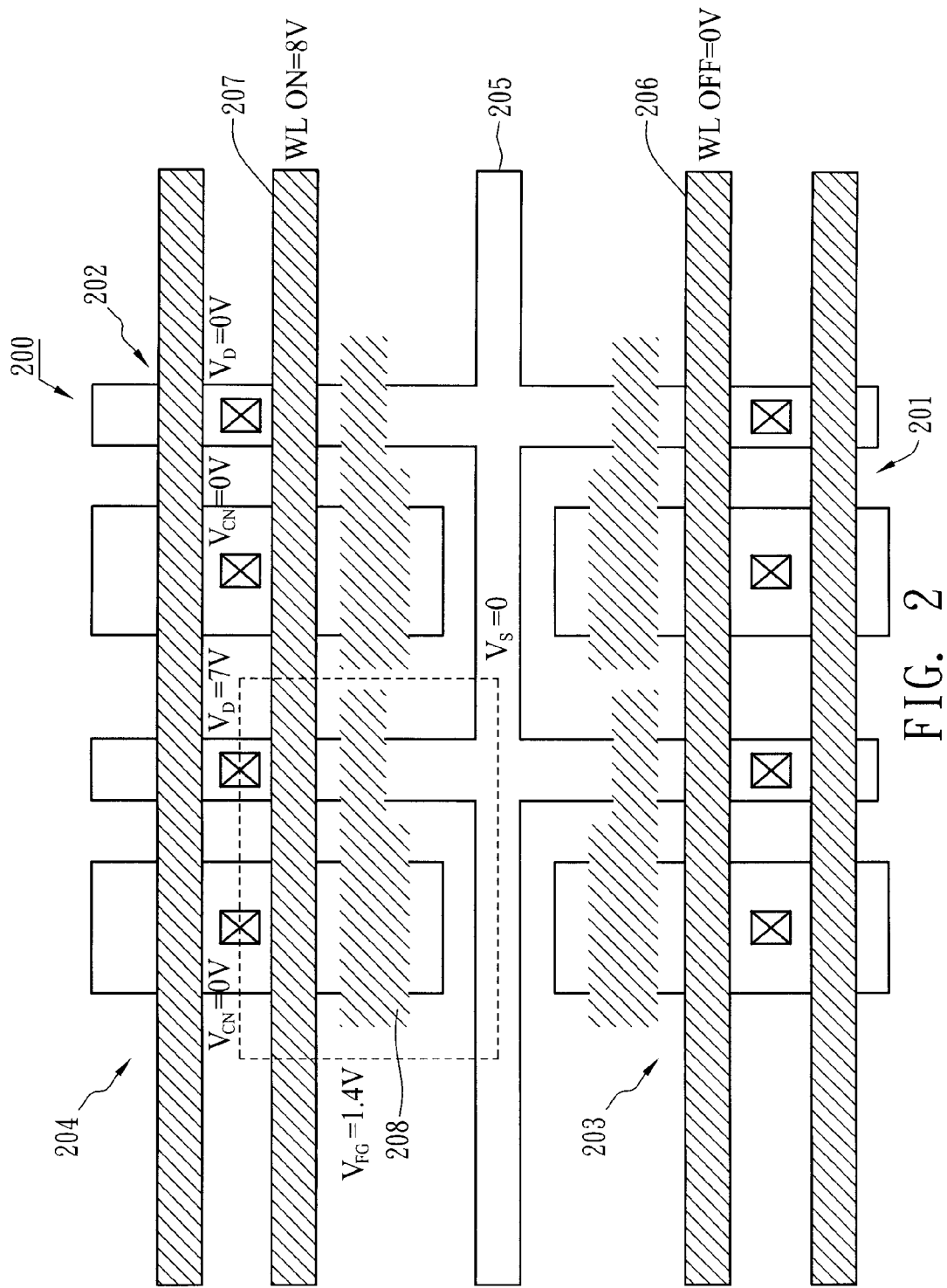
FIG. 2 shows a top view of the non-volatile memory cell according to one embodiment of the present invention.

FIG. 2 shows a top view of the non-volatile memory cell 200 according to one embodiment of the present invention. The embodiment lists the layouts of four cells, which are numbered from 201 to 204. The cells 201 and 204 share a source line 205. The cells 201 and 203 share a word line 206, and the cells 202 and 204 share another word line 207. The embodiment in FIG. 2 exemplifies the situation when an erasing operation is being executed. Because only the word line 207 of the cells 202 and 204 is at a high-voltage level (8 volts herein), only cells 202 and 204 are selected. Furthermore, only the floating gate 208 of the cell 204 possesses a voltage difference ($V_{CN}$=0V, $V_D$=7V), and thus an FN tunneling effect occurs only in the cell 204. The capacitance coupling effect generated by the voltage difference will generate 1.4 volts of coupling voltage so as to perform the erasing operation. Apparently, each cell of this embodiment has a separate voltage input, so no disturb path happens with its adjacent cell when a programming or erasing operation is being executed.

Figure 3:
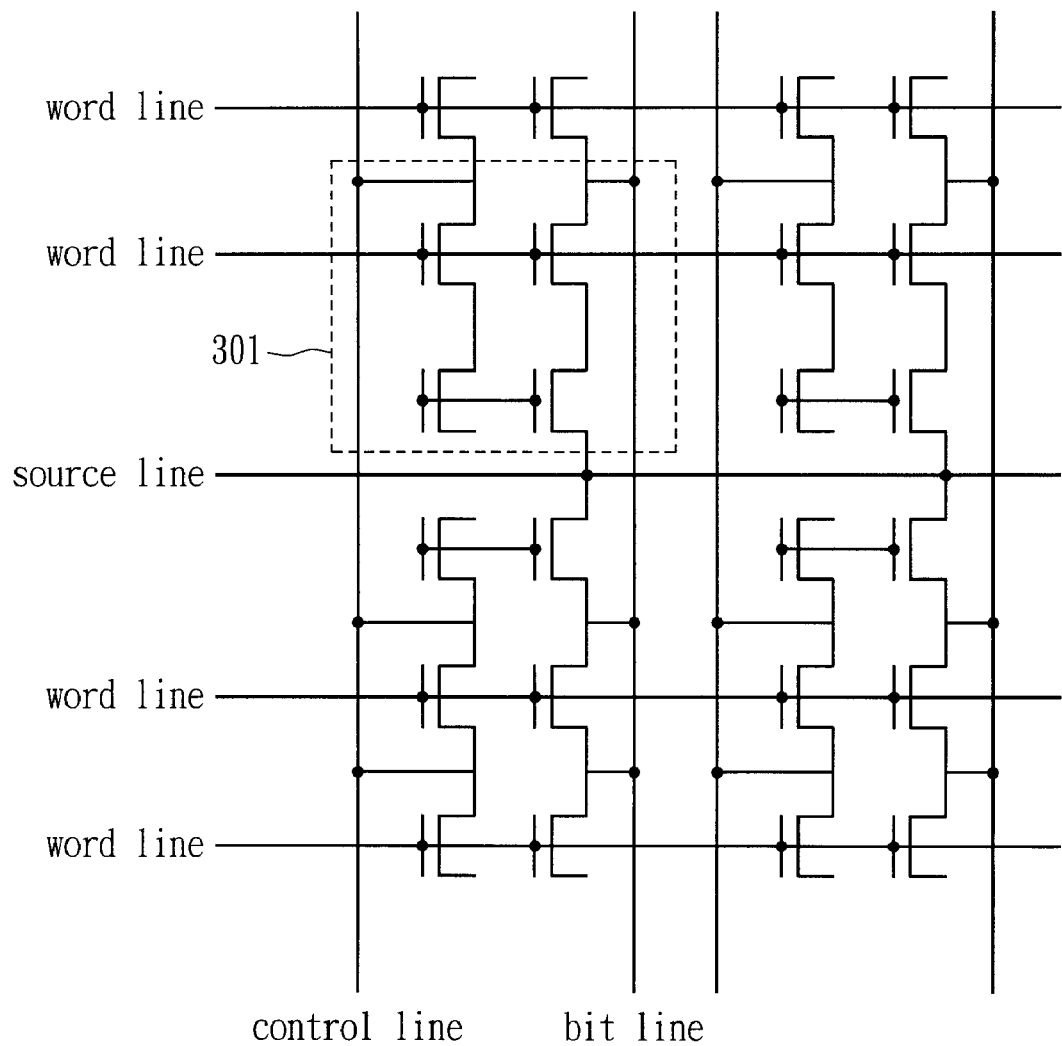
FIG. 3 is a corresponding circuit diagram of FIG. 2.

FIG. 3 is a circuit diagram corresponding to FIG. 2, where the region 301 enclosed by the dotted line corresponds to the cell 204 in FIG. 2. There are two more word lines in the circuit diagram of FIG. 3, and thus two more transistors, which are connected to the second and fourth transistors, are shown, compared with the non-volatile memory cell 100. Adding the second word line is optional, based on what kinds of applications are used.

Figure 4B:
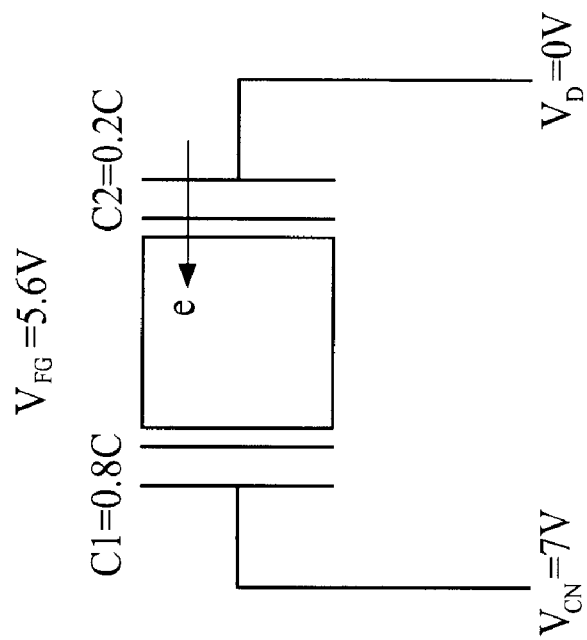
FIG. 4(b) shows a hint diagram of a programming operation of the present invention
Figure 4A:
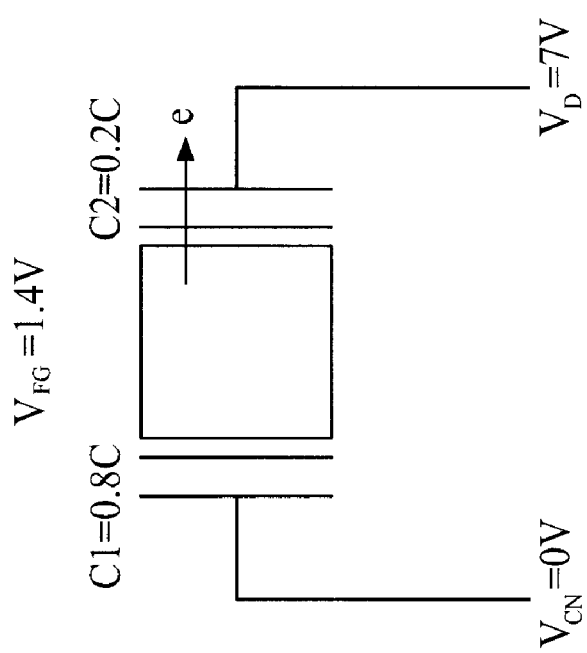
FIG. 4(a) is a hint diagram of an erasing operation of the present invention.

FIG. 4(a) is a hint diagram of the erasing operation of the present invention. When the control line of the non-volatile memory cell 100 is at 0 volt ($V_{CN}$=0V) and the bit line is at 7 volts ($V_D$=7V), the voltage difference of two terminals of the floating gate 111 generates a capacitance coupling effect, which allocates the voltage difference into two parts according to the capacitance ratio of two terminals of the floating gate 111, i.e., the ratio of the gate oxide capacitance of the first N-type transistor 101 to that of the third N-type transistor 103. For example, in FIG. 4(a), the capacitance of the first N-type transistor 101 occupies 20%, and the capacitance of the third N-type transistor 103 occupies 80%, and therefore the floating gate 111 generates a coupling voltage $V_{FG}$ of 1.4 volts. Because the voltage difference between the floating gate 111 and the third N-type transistor 103 is only 1.4 volts, it is not big enough to absorb electrons into the floating gate 111. However, the voltage difference between the floating gate 111 and the first N-type transistor 101 is about 5.6 volts, which is big enough to expel electrons from the floating gate 111 and proceed with an erasing operation.

Generally speaking, for generating an FN tunneling effect, the voltage difference between the floating gate 111 and the first N-type transistor 101 or between the floating gate 111 and the third N-type transistor 103 has to be greater than the threshold of about 6 to 10 mega volts/cm. Considering a normal thickness 70 A of a gate oxide layer, in the embodiment $$\frac{5.6V}{70A} = 8 \, MV/cm,$$

An FN tunnel effect occurs. However, because of $$\frac{1.4V}{70A} = 8 \, MV/cm,$$

an FN tunnel effect will not occur. To generate an FN tunneling effect, the ratio of the gate oxide capacitance of the first N-type transistor 101 to that of the third N-type transistor 103 is smaller than 2:3. Preferably, the ratio of the gate capacitance of the first N-type transistor 101 to that of the third N-type transistor 103 is between 1:3 and 1:100. More preferably, it is between 1:4 and 1:10. If the gate oxide of the first N-type transistor 101 has the same thickness as that of the third N-type transistor 103, the ratio of the gate capacitance of the first N-type transistor 101 to that of the third N-type transistor 103 is directly proportional to the ratio of the transistor size of the first N-type transistor 101 to that of the third N-type transistor 103.

FIG. 4(b) shows a hint diagram of a programming operation of the present invention. When a control line of a single-poly non-volatile memory cell 100 is at 7 volts ($V_{CN}$=7V) and the bit line at 0 volt ($V_D$=0V), at this time the voltage difference between the two terminals of the floating gate 111 will be allocated according to the capacitance ratio. In terms of FIG. 4(b), the capacitance of the first N-type transistor 101 occupies 20%, and the capacitance of the third N-type transistor 103 occupies 80%, and therefore the floating gate 111 generates a coupling voltage of 5.6 volts. Because only a voltage difference of 1.4 volts exists between the floating gate 111 and the third N-type transistor 103, it is not big enough to expel electrons from the floating gate 111. However, a voltage difference of 5.6 volts exists between the floating gate 111 and the first N-type transistor 101, which is big enough to absorb electrons into the floating gate 111 and proceed with a programming operation.

Figure 5B:
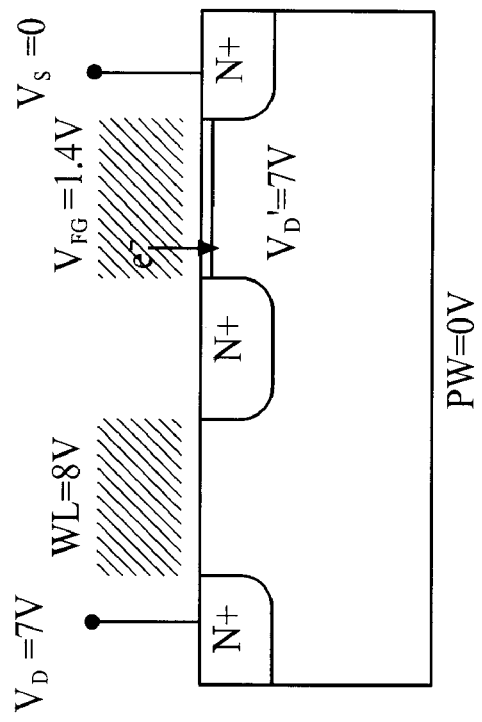
FIG. 5(b) shows a cross-sectional diagram along a C-C' line.
Figure 5A:
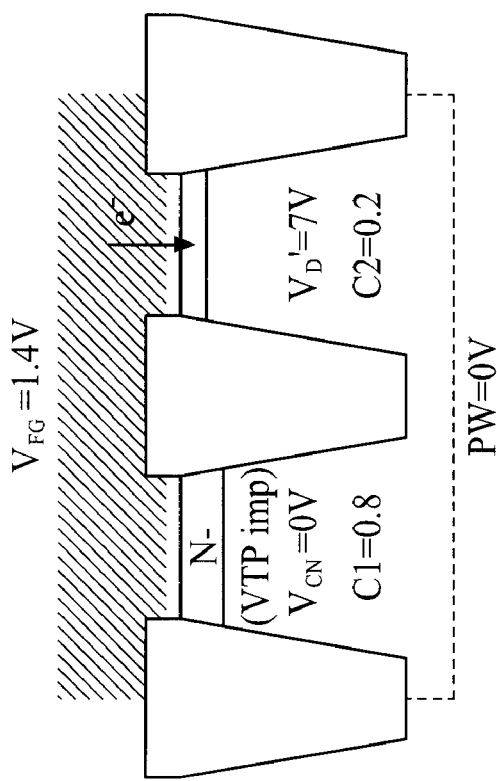
FIG. 5(a) shows a cross-sectional diagram along an A-A' line of the single-poly non-volatile memory cell of FIG. 1 when an erasing operation is performed.

FIG. 5(a) shows a cross-sectional diagram along an A-A' line of the single-poly non-volatile memory cell 100 of FIG. 1 when an erasing operation is performed, while FIG. 5(b) shows a cross-sectional diagram along a C-C' line. Because the bit line is at a 7-volt high voltage, the N channel close to the intersection of the floating gate 111 and the first N-type transistor 101 generates a channel inversion due to the FN tunneling effect and coupling voltage so that electrons will be expelled from the floating gate 111. It is notable that in a 0.18 μm process, the present invention could implant phosphorous or other N-type impurities by P-channel threshold voltage (VTP) process to enhance the coupling area. In a 0.13 μm process, for proceeding with the VTP process, an additional mask could be considered.

Figure 6B:
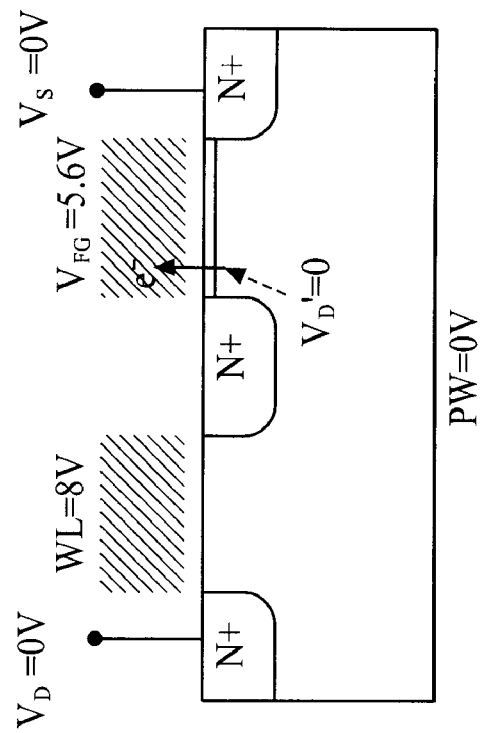
FIG. 6(b) shows a cross-sectional diagram along a C-C' line.
Figure 6A:
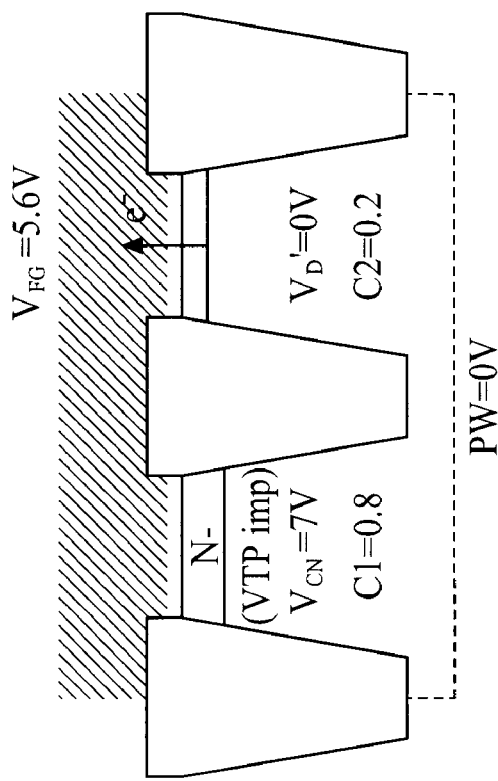
FIG. 6(a) shows a cross-sectional diagram along an A-A' line of the single-poly non-volatile memory cell of FIG. 1 when an erasing operation is performed.

FIG. 6(a) shows a cross-sectional diagram along an A-A' line of the single-poly non-volatile memory cell 100 of FIG. 1 when a programming operation is performed, while FIG. 6(b) shows a cross-sectional diagram along a C-C' line. Because the bit line is at 0-volt low voltage, the N channel close to the intersection of the floating gate 111 and the first N-type transistor 101 generates a channel inversion due to the FN tunneling effect and coupling voltage so that electrons will be absorbed into the floating gate 111.

Figure 7B:
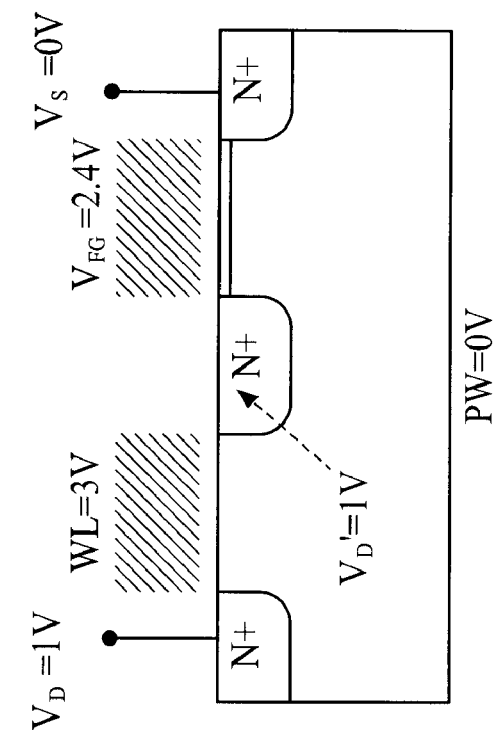
FIG. 7(b) shows a cross-sectional diagram along a C-C' line.
Figure 7A:
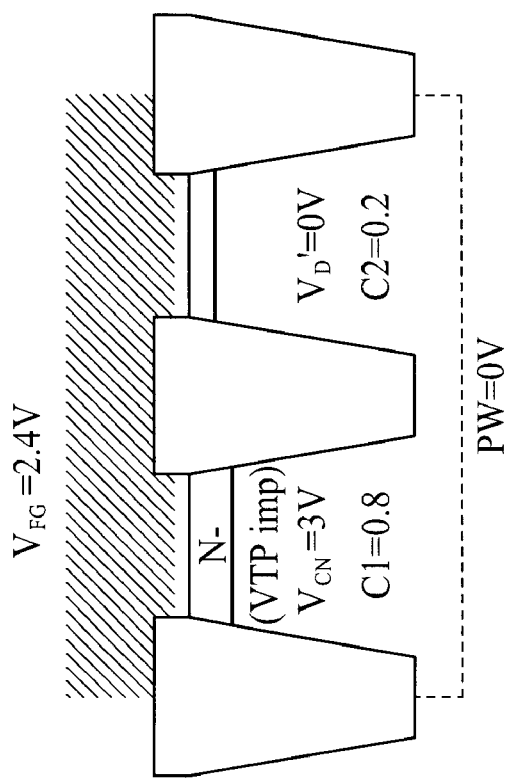
FIG. 7(a) shows a cross-sectional diagram along an A-A' line of the single-poly non-volatile memory cell of FIG. 1 when a reading operation is performed.

FIG. 7(a) shows a cross-sectional diagram along an A-A' line of the single-poly non-volatile memory cell 100 of FIG. 1 when a reading operation is performed, while FIG. 7(b) shows a cross-sectional diagram along a C-C' line. Because the bit line is at 1-volt low voltage, the coupling voltage of the floating gate 111 is only about 2.4 volts, which is not big enough to generate an FN tunneling effect.

Table 1 shows the operating voltage of the single-poly non-volatile memory cell 100 of the present invention when erasing, programming and reading operations are performed, where $V_D$ represents a bit line voltage, $V_{CN}$ represents a control line voltage, $V_{WL}$ represents a word line voltage, $V_S$ represents a source line voltage, and $V_{PW}$ represents a p-well voltage containing N-type transistor. $V_{WL}$ stays at 8-volt voltage so that transferring $V_D$ from the drain to the source will be easier.

TABLE 1

|  | $V_D$ | $V_{CN}$ | $V_{WL}$ | $V_S$ | $V_{PW}$ |
|---|---|---|---|---|---|
| programming | 0 volt | 7 volts | 8 volts | 0 volt | 0 volt |
| erasing | 7 volts | 0 volt | 8 volts | 0 volt | 0 volt |
| reading | 1 volt | 3 volts | 3 volts | 0 volt | 0 volt |

Table 2 is statistical data of the single-poly non-volatile memory cell 100 according to one embodiment of the present invention under a 3-volt design rule.

TABLE 2

|  | Prior art | The invention |
|---|---|---|
| No. of masks | 20~30 (2P3M) | 12~26 (1P2M) |
| Cell size | 0.09~1 μm² | 2~20 μm² |
| Gate oxide layer | 100 Å | 40~100 Å |
| Programming time | 4 μs | 3~8 ms |
| Erasing time | 40~60 ms | 3~8 ms |

Figure 8:
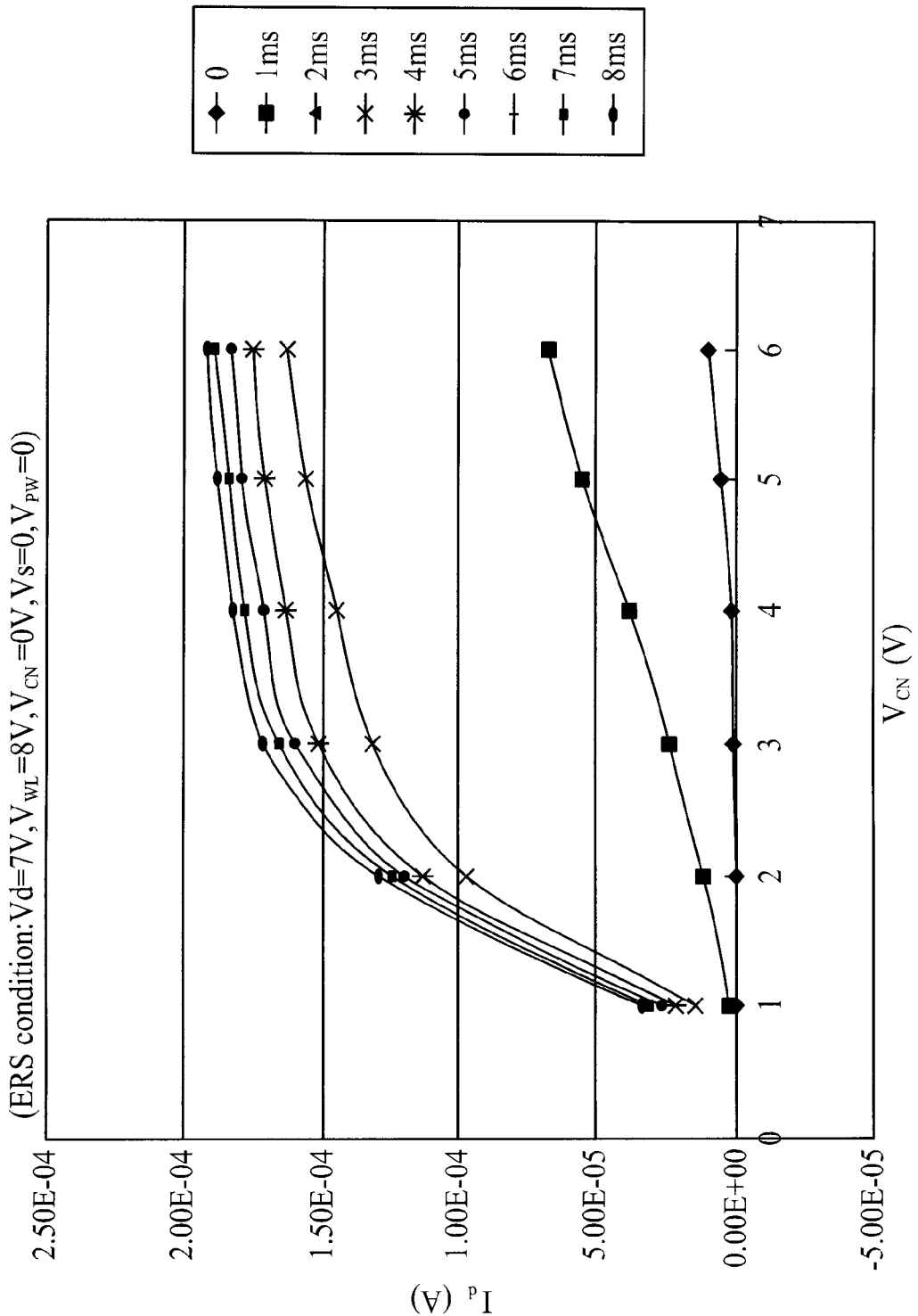
FIG. 8 shows a device characteristic diagram of the present invention.

FIG. 8 shows a device characteristic diagram of the present invention. The prior art current is about 40 to 60 μA. Compared with the prior art, it could be found from the device characteristic diagram of the present invention that a curve with 3 ms when $V_{CN}$ is 2 volts, or other curves slower than that, could reach the status of 100 μA.

The above-described embodiments of the present invention are intended to be illustrative only. Numerous alternative embodiments may be devised by persons skilled in the art without departing from the scope of the following claims.

What is claimed is:

1. A single-poly non-volatile memory, comprising a plurality of non-volatile memory cells, the non-volatile memory cells comprising:
   a first N-type transistor having a source, a gate and a drain, wherein the source connects to a source line;
   a second N-type transistor having a source, a gate and a drain, wherein the drain connects to a bit line, the source commonly shares the drain of the first transistor, and the gate connects to a word line;
   a third N-type transistor having a source, a gate and a drain;
   a fourth N-type transistor having a source, a gate and a drain, wherein the source commonly shares the drain of the third transistor, the drain connects to a control line, and the gate connects to the word line; and
   a floating gate connected to the gates of the first and third N-type transistors;
   wherein the ratio of the gate capacitance of the first N-type transistor to that of the third N-type transistor is smaller than 2:3.

2. The single-poly non-volatile memory of claim 1, wherein the non-volatile memory cell does not overlap an adjacent salicide region.

3. The single-poly non-volatile memory of claim 1, wherein the source of the first N-type transistor directly connects to the source line.

4. The single-poly non-volatile memory of claim 1, wherein the drain of the second N-type transistor connects to the bit line through a contact plug.

5. The single-poly non-volatile memory of claim 1, wherein the drain of the fourth N-type transistor connects to the control line through a contact plug.

6. The single-poly non-volatile memory of claim 1, wherein the non-volatile memory cell further comprises two N-type transistors, connecting to the drains of the second and fourth N-type transistors, respectively, and the gates of the two N-type transistors connect to another word line.

7. The single-poly non-volatile memory of claim 1, wherein the control line and word line are at a high voltage level, and the bit line, source line and a p-well containing the first to the fourth N-type transistors are at a low-voltage level when the non-volatile memory cell is selected and a programming operation is being executed.

8. The single-poly non-volatile memory of claim 1, wherein the bit line and word line are at a high voltage level, and the control line, source line and a p-well containing the first to the fourth N-type transistors are at a low-voltage level when the non-volatile memory cell is selected and an erasing operation is being executed.

9. The single-poly non-volatile memory of claim 1, wherein the control line and word line are at a medium voltage level, and the control line, source line and a p-well containing the first to the fourth N-type transistors are at a low-voltage level when the non-volatile memory cell is selected and a reading operation is being executed.

10. The single-poly non-volatile memory of claim 1, wherein the ratio of the gate capacitance of the first N-type transistor to that of the third N-type transistor is between 1:3 and 1:100.

11. The single-poly non-volatile memory of claim 1, wherein the ratio of the gate capacitance of the first N-type transistor to that of the third N-type transistor is between 1:4 and 1:10.

12. The single-poly non-volatile memory of claim 1, wherein the channel between the source and drain of the third N-type transistor implants N-type impurity by a VTP process.

13. A single-poly non-volatile memory, comprising a plurality of non-volatile memory cells, the non-volatile memory cell comprising:
   a storage node formed by N-type transistors, wherein one end connects to a source line, and the other end connects to a bit line through a contact plug;
   a control node formed by N-type transistors, wherein one end connects to a control line through a contact plug, and gates of the control node and storage node connect to a word line; and
   a floating gate connected to the other gates of the control node and storage node;

wherein the bit line is at a low voltage and the control line is at a high voltage level so that a coupling voltage occurs on the floating gate, wherein the voltage difference between the floating gate and the storage node is able to absorb electrons into the floating gate, but the voltage difference between the floating gate and the control node is not big enough to expel electrons from the floating gate when a programming operation is being executed;

wherein the bit line is at a high voltage and the control line is at a low voltage level so that a coupling voltage occurs on the floating gate, wherein the voltage difference between the floating gate and the storage node can expel electrons from the floating gate, but the voltage difference between the floating gate and the control node is not big enough to absorb electrons into the floating gate when an erasing operation is being executed.

14. The single-poly non-volatile memory of claim 13, wherein the voltage difference between the floating gate and the storage node over the thickness of a gate oxide of the storage node is between 6 to 10 mega volt/cm.

15. The single-poly non-volatile memory of claim 13, wherein the ratio of the other gate capacitance of the storage node to that of the control node is smaller than 2:3.

16. The single-poly non-volatile memory of claim 13, wherein the ratio of the other gate capacitance of the storage node to that of the control node is between 1:3 and 1:100.

17. The single-poly non-volatile memory of claim 13, wherein the ratio of the other gate capacitance of the storage node to that of the control node is between 1:4 and 1:10.

18. The single-poly non-volatile memory of claim 13, wherein the high voltage of the programming operation is the same as that of the erasing operation, and the low voltage of the programming operation is the same as that of the erasing operation.

19. The single-poly non-volatile memory of claim 13, wherein the word line voltage is slightly higher than the high voltage.

20. The single-poly non-volatile memory of claim 13, wherein the control line and word line are at a medium voltage level, and the bit line, source line and a p-well containing the control node and storage node are at a low-voltage level when the non-volatile memory cell is selected and a reading operation is being executed.

* * * * *